US010976386B2

(12) United States Patent
Alford et al.

(10) Patent No.: US 10,976,386 B2
(45) Date of Patent: Apr. 13, 2021

(54) MAGNETIC FIELD MEASUREMENT SYSTEM AND METHOD OF USING VARIABLE DYNAMIC RANGE OPTICAL MAGNETOMETERS

(71) Applicant: HI LLC, Los Angeles, CA (US)

(72) Inventors: Jamu Alford, Lake Arrowhead, CA (US); Ricardo Jiménez-Martinez, Culver City, CA (US)

(73) Assignee: HI LLC, Los Angeles, CA (US)

( * ) Notice: Subject to any disclaimer, the term of this patent is extended or adjusted under 35 U.S.C. 154(b) by 125 days.

(21) Appl. No.: 16/418,478

(22) Filed: May 21, 2019

(65) Prior Publication Data

US 2020/0025844 A1    Jan. 23, 2020

Related U.S. Application Data

(60) Provisional application No. 62/732,327, filed on Sep. 17, 2018, provisional application No. 62/699,596, filed on Jul. 17, 2018.

(51) Int. Cl.
  *G01R 33/26* (2006.01)
(52) U.S. Cl.
  CPC .................. *G01R 33/26* (2013.01)
(58) Field of Classification Search
  CPC .......... G01R 33/26; G01R 33/0017; G01R 33/0076; G01R 33/0094; H01F 27/02; H01F 27/06; H01F 27/12; H01F 27/26
  See application file for complete search history.

(56) References Cited

U.S. PATENT DOCUMENTS 3,173,082 A    3/1965 Bell et al.
3,257,608 A    6/1966 Bell et al.
(Continued)

FOREIGN PATENT DOCUMENTS

CN    104730484    6/2015
CN    106073751    11/2016
(Continued)

OTHER PUBLICATIONS

Allred, J. C., Lyman, R. N., Kornack, T. W., & Romalis, M. V. (2002). High-sensitivity atomic magnetometer unaffected by spin-exchange relaxation. Physical review letters, 89(13), 130801.
(Continued)

*Primary Examiner* — Jay Patidar
(74) *Attorney, Agent, or Firm* — Branch Partners PLLC; Bruce E. Black

(57) ABSTRACT

A magnetic field measurement system includes an array of magnetometers; at least one magnetic field generator configured to generate a compensation field across the array of magnetometers; and a controller coupled to the magnetometers and the at least one magnetic field generator and configured for adjusting a dynamic range and sensitivity of the array by adjusting a spatial variation of the compensation field to alter which of the magnetometers of the array operate in a measurement mode. Another magnetic field measurement system utilizes at least one magnetometer instead of the array. The controller is configured for adjusting a dynamic range and sensitivity of the array by adjusting a spatial variation of the compensation field to alter which of multiple domains within the at least one magnetometer operate in the measurement mode.

20 Claims, 8 Drawing Sheets

(56) References Cited

U.S. PATENT DOCUMENTS

| | | |
|---|---|---|
| 3,495,161 A | 2/1970 | Bell |
| 3,501,689 A | 3/1970 | Robbiano |
| 3,513,381 A | 5/1970 | Happer, Jr. |
| 4,193,029 A | 3/1980 | Cioccio et al. |
| 4,951,674 A | 8/1990 | Zanakis et al. |
| 5,189,368 A | 2/1993 | Chase |
| 5,192,921 A | 3/1993 | Chantry et al. |
| 5,225,778 A | 7/1993 | Chaillout et al. |
| 5,254,947 A | 10/1993 | Chaillout et al. |
| 5,309,095 A | 5/1994 | Ahonen et al. |
| 5,442,289 A | 8/1995 | Dilorio et al. |
| 5,444,372 A | 8/1995 | Wikswo, Jr. et al. |
| 5,471,985 A | 12/1995 | Warden |
| 5,506,200 A | 4/1996 | Hirschkoff et al. |
| 5,526,811 A | 6/1996 | Lypchuk |
| 5,713,354 A | 2/1998 | Warden |
| 6,144,872 A | 11/2000 | Graetz |
| 6,339,328 B1 | 1/2002 | Keene et al. |
| 6,472,869 B1 | 10/2002 | Upschulte et al. |
| 6,665,553 B2 | 12/2003 | Kandori et al. |
| 6,806,784 B2 | 10/2004 | Hollberg et al. |
| 6,831,522 B2 | 12/2004 | Kitching et al. |
| 7,038,450 B2 | 5/2006 | Romalis et al. |
| 7,102,451 B2 | 9/2006 | Happer et al. |
| 7,145,333 B2 | 12/2006 | Romalis et al. |
| 7,521,928 B2 | 4/2009 | Romalis et al. |
| 7,656,154 B2 | 2/2010 | Kawabata et al. |
| 7,826,065 B1 | 11/2010 | Okandan et al. |
| 7,872,473 B2 | 1/2011 | Kitching et al. |
| 7,994,783 B2 | 8/2011 | Ledbetter et al. |
| 8,054,074 B2 | 11/2011 | Ichihara et al. |
| 8,212,556 B1 * | 7/2012 | Schwindt .............. G01R 33/26 324/304 |
| 8,258,884 B2 | 9/2012 | Borwick, III et al. |
| 8,319,156 B2 | 11/2012 | Borwick, III et al. |
| 8,334,690 B2 | 12/2012 | Kitching et al. |
| 8,373,413 B2 | 2/2013 | Sugioka |
| 8,405,389 B2 | 3/2013 | Sugioka et al. |
| 8,587,304 B2 | 11/2013 | Budker et al. |
| 8,836,327 B2 | 9/2014 | French et al. |
| 8,906,470 B2 | 12/2014 | Overstolz et al. |
| 8,941,377 B2 | 1/2015 | Mizutani et al. |
| 9,084,549 B2 | 7/2015 | Desain et al. |
| 9,095,266 B1 | 8/2015 | Fu |
| 9,116,201 B2 | 8/2015 | Shah et al. |
| 9,140,590 B2 | 9/2015 | Waters et al. |
| 9,140,657 B2 | 9/2015 | Ledbetter et al. |
| 9,169,974 B2 | 10/2015 | Parse et al. |
| 9,244,137 B2 | 1/2016 | Kobayashi et al. |
| 9,291,508 B1 | 3/2016 | Biedermann et al. |
| 9,343,447 B2 | 3/2016 | Parsa et al. |
| 9,366,735 B2 | 6/2016 | Kawabata et al. |
| 9,383,419 B2 | 7/2016 | Mizutani et al. |
| 9,395,425 B2 | 7/2016 | Diamond et al. |
| 9,417,293 B2 | 8/2016 | Schaffer et al. |
| 9,429,918 B2 | 8/2016 | Parsa et al. |
| 9,568,565 B2 | 2/2017 | Parsa et al. |
| 9,575,144 B2 | 2/2017 | Kornack et al. |
| 9,601,225 B2 | 3/2017 | Parsa et al. |
| 9,638,768 B2 | 5/2017 | Foley et al. |
| 9,639,062 B2 | 5/2017 | Dyer et al. |
| 9,677,905 B2 | 6/2017 | Waters et al. |
| 9,726,626 B2 | 8/2017 | Smith et al. |
| 9,726,733 B2 | 8/2017 | Smith et al. |
| 9,791,536 B1 | 10/2017 | Alem et al. |
| 9,829,544 B2 | 11/2017 | Bulatowicz |
| 9,846,054 B2 | 12/2017 | Waters et al. |
| 9,851,418 B2 | 12/2017 | Wolf et al. |
| 9,869,731 B1 | 1/2018 | Hovde et al. |
| 9,915,711 B2 | 3/2018 | Kornack et al. |
| 9,927,501 B2 * | 3/2018 | Kim .................. G01R 33/032 |
| 9,948,314 B2 | 4/2018 | Dyer et al. |
| 9,964,609 B2 | 5/2018 | Ichihara et al. |
| 9,964,610 B2 | 5/2018 | Shah et al. |
| 9,970,999 B2 | 5/2018 | Larsen et al. |
| 9,995,800 B1 | 6/2018 | Schwindt et al. |
| 10,024,929 B2 | 7/2018 | Parsa et al. |
| 10,088,535 B1 | 10/2018 | Shah |
| 10,162,016 B2 | 12/2018 | Gabrys et al. |
| 10,194,865 B2 | 2/2019 | Le et al. |
| 10,314,508 B2 | 6/2019 | Desain et al. |
| 10,371,764 B2 | 8/2019 | Morales et al. |
| 2004/0232912 A1 | 11/2004 | Tsukamoto et al. |
| 2005/0007118 A1 | 1/2005 | Kitching et al. |
| 2005/0046851 A1 | 3/2005 | Riley, Jr. et al. |
| 2005/0206377 A1 | 9/2005 | Romalis et al. |
| 2007/0076776 A1 | 4/2007 | Lust et al. |
| 2007/0120563 A1 | 5/2007 | Kawabata et al. |
| 2007/0167723 A1 | 7/2007 | Park et al. |
| 2007/0205767 A1 | 9/2007 | Xu et al. |
| 2009/0079426 A1 | 3/2009 | Anderson |
| 2009/0101806 A1 | 4/2009 | Masuda |
| 2010/0219820 A1 | 9/2010 | Skidmore et al. |
| 2011/0062956 A1 | 3/2011 | Edelstein et al. |
| 2012/0112749 A1 | 5/2012 | Budker et al. |
| 2013/0082700 A1 * | 4/2013 | Mizutani .............. G01R 33/26 324/301 |
| 2013/0082701 A1 | 4/2013 | Mizutani et al. |
| 2013/0265042 A1 | 10/2013 | Kawabata et al. |
| 2014/0121491 A1 | 5/2014 | Zhang |
| 2014/0306700 A1 | 10/2014 | Kamada et al. |
| 2014/0354275 A1 | 12/2014 | Sheng et al. |
| 2015/0022200 A1 | 1/2015 | Ichihara et al. |
| 2015/0054504 A1 | 2/2015 | Ichihara et al. |
| 2015/0219732 A1 * | 8/2015 | Diamond ............ A61B 5/0522 324/201 |
| 2015/0378316 A1 | 12/2015 | Parsa et al. |
| 2016/0061913 A1 | 3/2016 | Kobayashi et al. |
| 2016/0116553 A1 | 4/2016 | Kim et al. |
| 2016/0223627 A1 * | 8/2016 | Shah .................. G01R 33/26 |
| 2016/0231395 A1 * | 8/2016 | Foley .................. G01R 33/032 |
| 2016/0291099 A1 | 10/2016 | Ueno |
| 2016/0313417 A1 | 10/2016 | Kawabata et al. |
| 2017/0023653 A1 | 1/2017 | Kobayashi et al. |
| 2017/0023654 A1 | 1/2017 | Kobayashi et al. |
| 2017/0067969 A1 | 3/2017 | Butters et al. |
| 2017/0199138 A1 | 7/2017 | Parse et al. |
| 2017/0199251 A1 | 7/2017 | Fujii et al. |
| 2017/0261564 A1 | 9/2017 | Gabrys et al. |
| 2017/0331485 A1 | 11/2017 | Gobet et al. |
| 2017/0343617 A1 | 11/2017 | Manickam et al. |
| 2017/0343695 A1 | 11/2017 | Stetson et al. |
| 2017/0356969 A1 | 12/2017 | Ueno |
| 2018/0003777 A1 | 1/2018 | Sorensen et al. |
| 2018/0038921 A1 | 2/2018 | Parsa et al. |
| 2018/0100749 A1 | 4/2018 | Waters et al. |
| 2018/0128885 A1 | 5/2018 | Parsa et al. |
| 2018/0156875 A1 | 6/2018 | Herbsommer et al. |
| 2018/0219353 A1 | 8/2018 | Shah |
| 2018/0238974 A1 | 8/2018 | Shah et al. |
| 2018/0313908 A1 | 11/2018 | Knappe et al. |
| 2018/0313913 A1 | 11/2018 | DeNatale et al. |
| 2019/0391213 A1 | 12/2019 | Alford |
| 2020/0025844 A1 | 1/2020 | Alford et al. |
| 2020/0057115 A1 | 2/2020 | Jiménez-Martínez et al. |
| 2020/0057116 A1 | 2/2020 | Zorzos et al. |
| 2020/0072916 A1 | 3/2020 | Alford et al. |
| 2020/0088811 A1 | 3/2020 | Mohseni |
| 2020/0103475 A1 * | 4/2020 | Kim .................. G01R 33/26 |
| 2020/0241094 A1 | 7/2020 | Alford |
| 2020/0256929 A1 | 8/2020 | Ledbetter et al. |
| 2020/0309873 A1 | 10/2020 | Ledbetter et al. |
| 2020/0334559 A1 | 10/2020 | Anderson et al. |
| 2020/0341081 A1 | 10/2020 | Mohseni et al. |
| 2020/0381128 A1 | 12/2020 | Pratt et al. |
| 2020/0400763 A1 | 12/2020 | Pratt |

FOREIGN PATENT DOCUMENTS

| | | |
|---|---|---|
| CN | 107562188 | 1/2018 |
| EP | 2738627 A3 | 6/2014 |
| EP | 2380029 B1 | 10/2015 |
| EP | 3037836 B1 | 9/2017 |
| JP | 2012100839 | 5/2012 |

(56) References Cited

FOREIGN PATENT DOCUMENTS

| JP | 2016109665 | 6/2016 |
|---|---|---|
| JP | 2018004462 | 1/2018 |
| WO | 2005/081794 | 9/2005 |
| WO | 2014/031985 | 2/2014 |
| WO | 2017/095998 | 6/2017 |

OTHER PUBLICATIONS

Balabas et al. Polarized alkali vapor with minute-long transverse spin-relaxation time, Phys. Rev. Lett. 105, 070801—Published Aug. 12, 2010.

Barbieri, F., Trauchessec, V., Caruso, L., Trejo-Rosillo, J., Telenczuk, B., Paul, E, . . . & Ouanounou, G. (2016). Local recording of biological magnetic fields using Giant Magneto Resistance-based micro-probes. Scientific reports, 6, 39330.

Dmitry Budker and Michael Romalis, "Optical Magnetometry," Nature Physics, 2008, https://arxiv.org/abs/physics/0611246v1.

Anthony P. Colombo, Tony R. Carter, Amir Borna, Yuan-Yu Jau, Cort N. Johnson, Amber L. Dagel, and Peter D. D. Schwindt, "Four-channel optically pumped atomic magnetometer for magnetoencephalography," Opt. Express 24, 15403-15416 (2016).

Dang, H.B. & Maloof, A.C. & Romalis, Michael. (2009). Ultra-high sensitivity magnetic field and magnetization measurements with an atomic magnetometer. Applied Physics Letters. 97. 10.1063/1.3491215.

Donley, E.A. & Hodby, E & Hollberg, L & Kitching. J. (2007). Demonstration of high-performance compact magnetic shields for chip-scale atomic devices. The Review of scientific instruments. 78, 083102.

Hämäläinen, Matti & Hari, Riitta & Ilmoniemi, Risto J. & Knuutila, Jukka & Lounasmaa, Olli V. Apr. 1993. Magnetoencephalograph-theory, instrumentation, and applications to noninvasive studies of the working human brain. Reviews of Modern Physics. vol. 65, Issue 2. 413-497.

Hunter, D. and Piccolomo; S. and Pritchard; J. D. and Brockie, N. L. and Dyer, T. E, and Riis, E. (2018) Free-induction-decay magnetometer based on a microfabricated Cs vapor cell. Physical Review Applied (10).ISSN 2331-7019.

Jiménez-Martinez, R., Griffith, W. C., Wang. Y. J., Knappe, S., Kitching, J., Smith, K., & Prouty, M. D. (2010). Sensitivity comparison of Mx and frequency-modulated bell—bloom Cs magnetometers in a microfabricated cell. IEEE Transactions on Instrumentation and Measurement, 59(2), 372-378.

Kiwoong Kim, Samo Begus, Hui Xia, Seung-Kyun Lee, Vojko Jazbinsek, Zvonko Trontelj, Michael V. Romalis, Multi-channel atomic magnetometer for magnetoencephalography: A configuration study. NeuroImage 89 (2014) 143-151 http://physics.princeton.edu/romalis/papers/Kim_2014.pdf.

Knappe, Svenja & Sander, Tilmann & Trahms, Lutz. (2012). Optically-Pumped Magnetometers for MEG. Magnetoencephalography: From Signals to Dynamic Cortical Networks. 993-999. 10.1007/978-3-642-33045-2_49.

Kominis; I.K., Kornack, T.W. Allred, J.C. and Romalis, M.V., 2003. A subfemtotesla multichannel atomic magnetometer. Nature, 422(6932), p. 596.

Korth, H., K. Strohbehn, F. Tejada, A. G. Andreou, J. Kitching, S. Knappe, S. J. Lehtonen, S. M. London, and M. Kafel (2016), Miniature atomic scalarmagnetometer for space based on the rubidium isotope 87Rb, J. Geophys. Res. Space Physics, 121, 7870-7880, doi:10.1002/2016JA022389.

Lenz, J. and Edelstein, S., 2006. Magnetic sensors and their applications. IEEE Sensors journal, 6(3), pp. 631-649.

Li, S & Vachaspati, Pranjal & Sheng, Dehong & Dural, Nezih & Romalis, Michael. (2011). Optical rotation in excess of 100 rad generated by Rb vapor in a multipass cell. Phys. Rev. A. 84. 10.1103/PhysRevA.84.061403.

Maze, J. R. Stanwix, P. L., Hodges, J. S., Hong, S., Taylor, J. M.; Cappellaro, P., . . . & Yacoby, A. (2008). Nanoscale magnetic sensing with an individual electronic spin in diamond. Nature, 455(7213), 644.

Sander TH, Preusser J, Mhaskar R, Kitching J, Trahms L, Knappe S. Magnetoencephalography with a chip-scale atomic magnetometer. Biomed Opt Express. 2012;3(5):981-90.

J. Seltzer, S & Romalis, Michael. (2010). High-temperature alkali vapor cells with antirelaxation surface coatings. Journal of Applied Physics. 106. 114905-114905. 10.1063/1.3236649.

Seltzer, S. J., and Romalis, M.V., "Unshielded three-axis vector operation of a spin-exchange-relaxation-free atomic magnetometer." Applied physics letters 85.20 (2004): 4804-4806.

Sheng, Dong & R. Perry, Abigail & Krzyzewski, Sean & Geller, Shawn & Kitching, John & Knappe, Svenja. (2017). A microfabricated optically-pumped magnetic gradiometer. Applied Physics Letters. 110, 10.1063/1.4974349.

Sheng, Dehong & Li, S & Dural, Nezih & Romalis, Michael, (2013). Subfemtotesla Scalar Atomic Magnetometry Using Multipass Cells. Physical review letters. 110. 160802. 10.1103/PhysRevLett.110.160802.

Volkmar Schultze et al. An Optically Pumped Magnetometer Working in the Light-Shift Dispersed Mz Mode, Sensors 2017, 17, 561; doi:10.3390/517030561.

Fang, J. and Qin, J., 2012. In situ triaxial magnetic field compensation for the spin-exchange-relaxation-free atomic magnetometer. Review of Scientific Instruments, 83(10), p. 103104.

Joon Lee, Hyun & Shim, Jeong & Moon, Han Seb & Kim, Kiwoong. (2014). Flat-response spin-exchange relaxation free atomic magnetometer under negative feedback. Optics Express. 22, 10.1364/OE.22.019887.

Griffith, Clark & Jimenez-Martinez, Ricardo & Shah, Vishal & Knappe, Svenja & Kitching, John, (2009). Miniature atomic magnetometer integrated with flux concentrators. Applied Physics Letters—Appl Phys Lett. 94. 10.1063/1.3056152.

Lee, S.-K & Romalis, Michael. (2008). Calculation of Magnetic Field Noise from High-Permeability Magnetic Shields and Conducting Objects with Simple Geometry. Journal of Applied Physics. 103. 084904-084904. 10.1063/1.2885711.

Vovrosh, Jamie & Voulazeris, Georgios & Petrov, Plamen & Zou, Ji & Gaber Beshay, Youssef & Benn, Laura & Woolger, David & Attallah, Moataz & Boyer, Vincent & Bongs, Kai & Holynski, Michael. (2018). Additive manufacturing of magnetic shielding and ultra-high vacuum flange for cold atom sensors. Scientific Reports. 8. 10.1038/s41598-018-20352-x.

Kim, Young Jin & Savukov, I. (2016). Ultra-sensitive Magnetic Microscopy w th an Optically Pumped Magnetometer. Scientific Reports. 6. 24773. 10.1038/srep24773.

Navau, Carles & Prat-Camps, Jordi & Sanchez, Alvaro. (2012). Magnetic Energy Harvesting and Concentration at a Distance by Transformation Optics. Physical review letters. 109. 263903. 10.1103/PhysRevLett.109.263903.

Orang Alem, Rahul Mhaskar, Ricardo Jiménez-Martinez, Dong Sheng, John LeBlanc, Lutz Trahms, Tilmann Sander, John Kitching, and Svenja Knappe, "Magnetic field imaging with microfabricated optically-pumped magnetometers," Opt. Express 25, 7849-7858 (2017).

Slocum et al., Self-Calibrating Vector Magnetometer for Space, https://esto.nasa.gov/conferences/estc-2002/Papers/B3P4(Slocum).pdf.

Dupont-Roc, J & Haroche, S & Cohen-Tannoudji, C. (1969), Detection of very weak magnetic fields (10-9gauss) by 87Rb zero-field level crossing resonances. Physics Letters A—Phys Lett A. 28. 638-639. 10.1016/0375-9601(69)90480-0.

J. A. Neuman, P. Wang, and A. Gallagher, Robust high-temperature sapphire cell for metal vapors, Review of Scientific Instruments, vol. 66. Issue 4. Apr. 1995, pp. 3021-3023.

Borna, Amir, et al. "A 20-channel magnetoencephalography system based on optically pumped magnetometers." Physics in Medicine & Biology 62.23 (2017): 8909.

R. E. Slocum & L. J. Ryan, Design and operation of the minature vector laser magnetometer, Nasa Earth Science Technology Conference 2003.

(56) References Cited

OTHER PUBLICATIONS

Schoenmaker, Jeroen & R Pirate, K & Teixeira, Julio. (2013), Magnetic flux amplification by Lenz lenses. The Review of scientific instruments. 84, 085120. 10.1063/1.4819234.

Hu, Yanhui & Hu, Zhaohui & Liu, Xuejing & Li; Yang & Zhang, Ji & Yao, Han & Ding, Ming. (2017). Reduction of far off-resonance laser frequency drifts based on the second harmonic of electro-optic modulator detection in the optically pumped pumped magnetometer. Applied Optics, 56. 5927. 10.1364/AO.56.005927.

Masuda, Y & Ino, T & Skoy, Vadim & Jones; G.L. (2005), 3He polarization via optical pumping in a birefringent cell. Applied Physics Letters. 87, 10.1063/1.2008370.

A.B. Baranga et al., An atomic magnetometer for brain activity imaging. Real Time Conference 2005. 14th IEEE-NPSS. pp. 417-418.

Larry J. Ryan; Robert E. Slocum, and Robert B. Steves, Miniature Vector Laser Magnetometer Measurements of Earth's Field, May 10, 2004, 4 pgs.

Lorenz, V. O., Dai, X., Green, H., Asnicar, T. R., & Cundiff, S. T, (2008). High-density, high-temperature alkali vapor cell. Review of Scientific Instruments, 79(12), 4 pages.

F. Jackson Kimball, D & Dudley, J & Li, Y & Thulasi, Swecha & Pustelny, Szymon & Budker, Dmitry & Zolotorev, Max, (2016). Magnetic shielding and exotic spin-dependent interactions. Physical Review D. 94. 10.1103/PhysRevD.94.082005.

Huang, Haichao, et al. "Single-beam three-axis atomic magnetometer." Applied Physics Letters 109.6 (2016): 062404. (Year: 2016).

Hill RM, Bobo E, Holmes N, et al. A tool for functional brain imaging with lifespan compliance [published correction appears in Nat Commun. Dec. 4, 2019;10(1):5628]. Nat Commun. 2019;10(1):4785. Published Nov. 5, 2019. doi:10.1038/s41467-019-12486-x.

Zetter, R., Iivanainen, J. & Parkkonen, L. Optical Co-registration of MRI and On-scalp MEG. Sci Rep 9, 5490 (2019). https://doi.org/10.1038/s41598-019-41763-4.

Garrido-Jurado, Sergio, Rafael Muñoz-Salinas, Francisco José Madrid-Cuevas and Manuel J. Marin-Jiménez. "Automatic generation and detection of highly reliable fiducial markers under occlusion." Pattern Recognit. 47 (2014):2280-2292.

Hill RM, Bobo E, Rea M, et al. Multi-channel whole-head OPM-MEG: Helmet design and a comparison with a conventional system [published online ahead of print, May 29, 2020]. Neuroimage. 2020;219:116995. doi:10.1016/j.neuroimage.2020.116995.

V. Kazemi and J. Sullivan, "One millisecond face alignment with an ensemble of regression trees," 2014 IEEE Conference on Computer Vision and Pattern Recognition, Columbus, OH, 2014, pp. 1867-1874, doi: 10.1109/CVPR.2014.241.

Holmes, N., Tierney, T.M., Leggett, J. et al. Balanced, bi-planar magnetic field and field gradient coils for field. compensation in wearable magnetoencephalography. Sci Rep 9, 14196 (2019).

V. Holmes, J. Leggett, E. Boto, G. Roberts, R.M. Hill, T.M. Tierney, V. Shah, G.R. Barnes, M.J. Brookes, R. Bowtell A bi-planar coil system for nulling background magnetic fields in scalp mounted magnetoencephalography Neuroimage, 181 (2018), pp. 760-774.

J. M. Leger et. al., In-flight performance of the Absolute Scalar Magnetometer vector mode on board the Swarm satellites, Earth, Planets, and Space (2015) 67:57.

Alexandrov, E. B., Balabas, M. V., Kulyasov, V. N., Ivanov, A. E., Pazgalev, A. S., Rasson, J. L., . . . (2004). Three-component variometer based on a scalar potassium sensor. Measurement Science and Technology, 15(5), 918-922.

Gravrand, O., Khokhlov, A., & JL, L. M. (2001). On the calibration of a vectorial 4He pumped magnetometer. Earth, planets and space , 53 (10), 949-958.

Borna, Amir & Carter, Tony & Colombo, Anthony & Jau, Y-Y & McKay, Jim & Weisend, Michael & Taulu, Samu & Stephen, Julia & Schwindt, Peter. (2018). Non-Invasive Functional-Brain-Imaging with a Novel Magnetoencephalography System. 9 Pages.

Vrba J, Robinson SE. Signal processing in magnetoencephalography. Methods. 2001;25(2):249-271. doi:10.1006/meth.2001.1238.

Uusitalo M and Ilmoniemi R., 1997, Signal-space projection method for separating MEG or EEG into components. Med. Biol. Comput. (35) 135-140.

Taulu S and Kajola M., 2005, Presentation of electromagnetic multichannel data: the signal space separation method. J. Appl. Phys. (97) 124905 (2005).

Taulu S, Simola J and Kajola M., 2005, Applications of the signal space separation method. IEEE Trans. Signal Process. (53) 3359-3372 (2005).

Taulu S, Simola J., 2006, Spatiotemporal signal space separation method for rejecting nearby interference in MEG measurements. Phys. Med. Biol. (51) 1759-1768 (2006).

Johnson, et al., Magnetoencephalography with a two-color pump-probe, fiber-coupled atomic magnetometer, Applied Physics Letters 97, 243703 2010.

Zhang, et al., Magnetoencephalography using a compact multichannel atomic magnetometer with pump-probe configuration, AIP Advances 8, 125028 (2018).

Xia, H. & Ben-Amar Baranga, Andrei & Hoffman, D. & Romalis, Michael. (2006). Magnetoencephalography with an atomic magnetometer. Applied Physics Letters—Appl Phys Lett. 89. 10.1063/1.2392722.

Ilmoniemi, R. (2009). The triangle phantom in magnetoencephalography. In 24th Annual Meeting of Japan Biomagnetism and Bioelecctromagnetics Society, Kanazawa, Japan, 28.29.5.2009 (pp. 6263).

Oyama D. Dry phantom for magnetoencephalography—Configuration, calibration, and contribution. J Neurosci Methods. 2015;251:24-36. doi: 0.1016/j.jneumeth.2015.05.004.

Chutani, R., Maurice, V., Passilly, N. et al. Laser light routing in an elongated micromachined vapor cell with diffraction gratings for atomic clock applications. Sci Rep 5, 14001 (2015). https://doi.org/10.1038/srep14001.

Eklund, E. Jesper, Andrei M. Shkel, Svenja Knappe, Elizabeth A. Donley and John Kitching. "Glass-blown spherical microcells for chip-scale atomic devices." (2008).

Jiménez-Martinez R, Kennedy DJ, Rosenbluh M, et al. Optical hyperpolarization and NMR detection of 129Xe on a microfluidic chip. Nat Commun. 2014;5:3908. Published May 20, 2014. doi:10.1038/ncomms4908.

Boto, Elena, Sofie S. Meyer, Vishal Shah, Orang Alem, Svenja Knappe, Peter Kruger, T. Mark Fromhold, et al. "A New Generation of Magnetoencephalography: Room Temperature Measurements Using Optically-Pumped Magnetometers" NeuroImage 149 (Apr. 1, 2017): 404-14.

Bruno, A. C., and P. Costa Ribeiro. "Spatial Fourier Calibration Method for Multichannel SQUID Magnetometers." Review of Scientific Instruments 62, No. 4 (Apr. 1, 1991): 1005-9.

Chella, Federico, Filippo Zappasodi, Laura Marzetti, Stefania Della Penna, and Vittorio Pizzella. "Calibration of a Multichannel MEG System Based on the Signal Space Separation Method." Physics in Medicine and Biology 57 (Jul. 13, 2012): 4855-70.

Pasguarelli, A, M De Melis, Laura Marzetti, Hans-Peter Willer, and S N Erné. "Calibration of a Vector-MEG Helmet System." Neurology & Clinical Neurophysiology□: NCN 2004 (Feb. 1, 2004): 94.

Pfeiffer, Christoph, Lau M. Andersen, Daniel Lundqvist, Matti Hämäläinen, Justin F. Schneiderman, and Robert Oostenveld. "Localizing On-Scalp MEG Sensors Using an Array of Magnetic Dipole Coils." PLOS ONE 13, No. 5 (May 10, 2018): e0191111.

Vivaldi, Valentina, Sara Sommariva, and Alberto Sorrentino. "A Simplex Method for the Calibration of a MEG Device." Communications in Applied and Industrial Mathematics 10 (Jan. 1, 2019): 35-46.

Nagel, S., & Spüler, M. (2019). Asynchronous non-invasive high-speed BCI speller with robust non-control state detection. Scientific Reports, 9(1), 8269.

Thielen, J., van den Broek, P., Farquhar, J., & Desain, P. (2015). Broad-Band Visually Evoked Potentials: Re(con) volution in Brain-Computer Interfacing. PloS One, 10(7), e0133797. https://doi.org/10.1371/journal.pone.0133797.

J. Kitching, "Chip-scale atomic devices," Appl. Phys. Rev. 5(3), 031302 (2018), 39 pages.

(56) References Cited

OTHER PUBLICATIONS

Manon Kok, Jeroen D. Hol and Thomas B. Schon (2017), "Using Inertial Sensors for Position and Orientation Estimation", Foundations and Trends in Signal Processing: vol. 11: No. 1-2, pp. 1-153. http://dx.doi.org/10.1561/2000000094.

Scott Jeffrey Seltzer: "Developments in alkali-metal atomic magnetometry", Nov. 1, 2008 (Nov. 1, 2008), XP055616618, ISBN: 978-0-549-93355-7 Retrieved from the Internet: URL:http://physics.princeton.edu/atomic/romalis/papers/Seltzer%20Thesis.pdf [retrieved on Aug. 29, 2019] pp. 148-159.

Haifeng Dong et al: "Atomic-Signal-Based Zero-Field Finding Technique for Unshielded Atomic Vector Magnetometer", IEEE Sensors Journal, IEEE Service Center, New York, NY, US, vol. 13, No. 1, Jan. 1, 2013 (Jan. 1, 2013), pp. 186-189.

Boto, E, Holmes, N, Leggett, J, Roberts, G, Shah, V, Meyer, SS, Muñoz, LD, Mullinger, KJ, Tierney, TM, Bestmann, S, Barnes, GR, Bowtell, R & Brookes, MJ 2018, 'Moving magnetoencephalography towards real world applications with a wearable', Nature, vol. 555, pp. 657-661.

Ijsselsteijn, R & Kielpinski, Mark & Woetzel, S & Scholtes, Theo & Kessler, Ernst & Stolz, Ronny & Schultz, V & Meyer, H-G. (2012). A full optically operated magnetometer array: An experimental study. The Review of scientific instruments. 83. 113106. 10.1063/1.4766961.

Tierney, T. M., Holmes, N., Meyer, S. S., Boto, E., Roberts, G., Leggett, J., . . . Barnes, G. R. (2018). Cognitive neuroscience using wearable magnetometer arrays: Non-invasive assessment of language function. NeuroImage, 181, 513-520.

Arjen Stolk, Ana Todorovic, Jan-Mathijs Schoffelen, and Robert Oostenveld. "Online and offline tools for head movement compensation in MEG." Neuroimage 68 (2013): 39-48.

Bagherzadeh, Yasaman, Daniel Baldauf, Dimitrios Pantazis, and Robert Desimone. "Alpha synchrony and the neurofeedback control of spatial attention." Neuron 105, No. 3 (2020): 577-587.

\* cited by examiner

MAGNETIC FIELD MEASUREMENT SYSTEM AND METHOD OF USING VARIABLE DYNAMIC RANGE OPTICAL MAGNETOMETERS

CROSS-REFERENCE TO RELATED APPLICATIONS

This application claims the benefit of U.S. Provisional Patent Applications Ser. Nos. 62/699,596, filed Jul. 17, 2018, and 62/732,327, filed Sep. 17, 2018, both of which are incorporated herein by reference in their entirety.

FIELD

The present disclosure is directed to the area of magnetic field measurement systems using optical magnetometers. The present disclosure is also directed to magnetic field measurement systems with variable dynamic range.

BACKGROUND

Optical magnetometry is the use of optical methods to measure a magnetic field with very high accuracy, for example, on the order of $1 \times 10^{-15}$ Tesla. A vector magnetometer is a type of magnetometer that can be used to determine the magnetic field components along one, two or three Cartesian axes. The spin-exchange-relaxation-free (SERF) method is one way to create a highly sensitive vector magnetometer based on zero-field magnetic resonances. However, due to the intrinsic dynamic range of zero-field resonances SERF magnetometers can typically only operate in an ambient background magnetic field environment ranging from 0 nT to a few tens of nT. Since this sensitivity range is far below the background magnetic field strength of the Earth, passive and active shielding are conventionally employed. Due to its limited dynamic range, a SERF magnetometer cannot be used to measure (and therefore suppress through electromagnetic inductors) the Earth's magnetic field, which has a magnitude that varies from a few 1,000 nT to 80,000 nT depending on location.

In the nervous system, neurons communicate via action potentials, which transmit information through brief electric currents which flow down the length of neuron causing chemical messengers to be released at the synapse. The time-varying electrical current within the neuron generates a magnetic field. For neural signals in the brain, the magnetic field can propagate beyond the human head and can be observed. Neural and other electrical signals in other parts of the body also generate an observable magnetic field. Conventional observation and measurement devices, for example, a Superconductive Quantum Interference Device (SQUID) or an Optical Magnetometer (OM) or any other suitable magnetic field detector can be used for detection. One challenge with a SQUID detector is that it requires cryogenic cooling which can be costly and bulky.

BRIEF SUMMARY

One embodiment is a magnetic field measurement system that includes an array of magnetometers, wherein each magnetometer is configured to operate in a measurement mode over a first range of magnetic fields; at least one magnetic field generator with the at least one magnetic field generator configured to generate a compensation field across the array of magnetometers; and a controller coupled to the magnetometers and the at least one magnetic field generator, the controller comprising a processor configured for receiving signals from the magnetometers, observing or measuring a magnetic field from the received signals, and controlling the at least one magnetic field generator to generate the compensation field resulting in one or more of the magnetometers operating in the measurement mode, wherein the processor is further configured for adjusting a dynamic range and sensitivity of the array by adjusting a spatial variation of the compensation field to alter which of the magnetometers of the array operate in the measurement mode.

In at least some embodiments, the magnetometers utilize alkali metal vapor and the measurement mode is a spin-exchange-relaxation-free (SERF) mode.

In at least some embodiments, the processor is configured to increase the dynamic range of the array of magnetometers by adjusting the spatial variation of the compensation field to decrease the number of the magnetometers of the array operating in the measurement mode. In at least some embodiments, the processor is configured to decrease the dynamic range of the array of magnetometers by adjusting the spatial variation of the compensation field to increase the number of the magnetometers of the array operating in the measurement mode.

In at least some embodiments, the processor is configured to increase the sensitivity of the array of magnetometers by adjusting the spatial variation of the compensation field to increase the number of the magnetometers of the array operating in the measurement mode. In at least some embodiments, the processor is configured to decrease the sensitivity of the array of magnetometers by adjusting the spatial variation of the compensation field to decrease the number of the magnetometers of the array operating in the measurement mode.

In at least some embodiments, the processor is configured for controlling the at least one magnetic field generator to adjust the spatial variation of the compensation field so that the magnetometers operating in the measurement mode are disposed in the center of the array. In at least some embodiments, the array is a one-dimensional array. In at least some embodiments, the array is a two- or three-dimensional array. In at least some embodiments, the processor is configured for determining a first or higher order magnetic field gradient from the received signals.

Another embodiment is a magnetic field measurement system that includes at least one magnetometer, wherein each of the at least one magnetometer comprises a gas cell and a detector array, wherein the detector array is configured to individually observe each of a plurality of domains in the gas cell; at least one magnetic field generator with the at least one magnetic field generator configured to generate a compensation field across the at least one magnetometer; and a controller coupled to the at least one magnetometer and the at least one magnetic field generator, the controller comprising a processor configured for receiving signals from the detector array of the at least one magnetometer, observing or measuring a magnetic field from the received signals, and controlling the at least one magnetic field generator to generate the compensation field resulting in one or more of the domains of the at least one magnetometer operating in the measurement mode, wherein the processor is further configured for adjusting a dynamic range and sensitivity of the array by adjusting a spatial variation of the compensation field to alter which of the domains of the at least one magnetometer operate in the measurement mode.

In at least some embodiments, the gas cell is an alkali metal vapor cell and the measurement mode is a spin-exchange-relaxation-free (SERF) mode.

In at least some embodiments, the processor is configured to increase the dynamic range of the detector array by adjusting the spatial variation of the compensation field to decrease the number of the domains operating in the measurement mode. In at least some embodiments, the processor is configured to decrease the dynamic range of the detector array by adjusting the spatial variation of the compensation field to increase the number of the domains operating in the measurement mode.

In at least some embodiments, the processor is configured to increase the sensitivity of the detector array by adjusting the spatial variation of the compensation field to decrease the number of the domains operating in the measurement mode. In at least some embodiments, the processor is configured to decrease the sensitivity of the detector array by adjusting the spatial variation of the compensation field to increase the number of the domains operating in the measurement mode.

In at least some embodiments, the processor is configured for controlling the at least one magnetic field generator to adjust the spatial variation of the compensation field so that the domains operating in the measurement mode are disposed in the center of the at least one magnetometer.

A further embodiment is a method of measuring a magnetic field that includes measuring an ambient background magnetic field using any of the magnetic field measurement systems described above; setting the compensation field based on the measurement of the ambient background magnetic field; and measuring and recording the magnetic field.

In at least some embodiments, the method further includes setting the magnetic field measurement system to a high dynamic range and measuring the magnetic field; updating the compensation field, based on the measuring of the magnetic field, to set the magnetic field measurement system to a lower dynamic range; wherein measuring and recording the magnetic field includes measuring and recording the magnetic field with the magnetic field measurement system set to the lower dynamic range.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

Figure 1A:
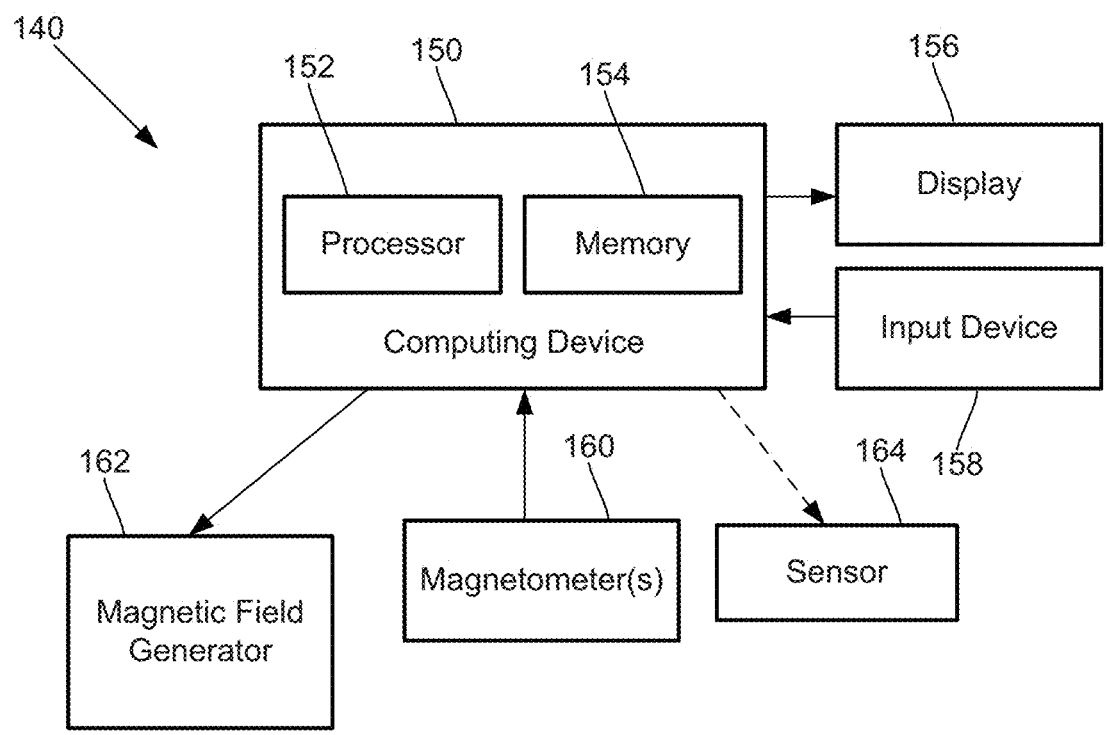
FIG. 1A is a schematic block diagram of one embodiment of a magnetic field measurement system, according to the invention.

The present disclosure is directed to the area of magnetic field measurement systems using optical magnetometers. The present disclosure is also directed to magnetic field measurement systems with variable dynamic range.

A variety of different zero-field magnetometers can be used in the systems and methods described herein. These magnetometers have a measurement mode over a range of magnetic fields, typically, near zero field. Magnetometers utilizing gas cells with alkali metal vapor and which can operate in the spin-exchange-relaxation-free (SERF) mode (e.g., a measurement mode) are used herein as an example. It will be understood that other zero-field magnetometers may be substituted in the systems and methods described below. For example, a helium-based magnetometer (for example, the Vector Laser Magnetometer described, for example, in Slocum, et al. *IEEE Transactions on Magnetics*, 9(3), 221-226 (1973); Slocum, et al., *Earth Science Technology Conference Proceedings*, 2003; and Slocum, et al., "Helium magnetometers), *Optical Magnetometry* (ed. Budker, D. and Jackson Kimball, D. F.), Cambridge University Press, 190-204 (2013), all of which are incorporated herein by reference) can be used in place of the alkali-metal-based magnetometers described herein.

Although zero-field sensors have been known for the past several decades, they only reached state-of-the-art sensitivities recently by operating in the SERF regime. In this regime the rate of spin-exchange collisions, Rse, which typically introduce decoherence, is much faster than the Larmor precession rate, $w_0=\gamma|B|$, where $\gamma$ is the gyromagnetic ratio of the atom and $|B|$ is the strength of the magnetic field. The spin-exchange collision rate is given by $Rse=\sigma_{se}vn_{Al}$, with the cross-section for spin-exchange collisions $\sigma_{se}=2\times10^{-14}$ cm$^2$, the relative thermal speed of two colliding alkali atoms $v\sim10^4$ cm/s at the temperature of 150° C., and $n_{Al}$ denotes the alkali vapor density. For practical purposes, conventionally SERF is achieved when $Rse>10\omega_0$, which is achieved at low magnetic fields Bo and large alkali vapor densities.

The transition from SERF to the standard spin-exchange broadened regime can be used, given knowledge of the atomic density, to characterize whether a sensor is in the SERF regime or not. As one example, to carry out this characterization, one can compare the measured T2 time of the spin ensemble with the expected relaxation due to spin-exchange collisions at the given alkali density.

A magnetic field measurement system, as described herein, can include one or more (for example, an array of) magnetometers, for example, one or more SERF zero-field vector magnetometers. The magnetic field measurement system can be used to measure or observe electromagnetic signals generated by one or more sources (for example, biological sources). The system can measure biologically generated magnetic fields and, at least in some embodiments, can measure biologically generated magnetic fields in an unshielded environment. Aspects of a magnetic field measurement system will be exemplified below using magnetic signals from the brain of a user; however, biological signals from other areas of the body, as well as non-biological signals, can be measured using the system. Uses for this technology outside biomedical sensing include, but are not limited to, navigation, mineral exploration, non-destructive testing, detection of underground devices, asteroid mining, and space travel.

Herein the terms "ambient background magnetic field" and "background magnetic field" are interchangeable and used to identify the magnetic field or fields associated with sources other than the magnetic field measurement system and the biological source(s) (for example, neural signals from a user's brain) or other source(s) of interest. The terms can include, for example, the Earth's magnetic field, as well as magnetic fields from magnets, electromagnets, electrical devices, and other signal or field generators in the environment, except for the magnetic field generator(s) that are part of the magnetic field measurement system.

FIG. 1A is a block diagram of components of one embodiment of a magnetic field measurement system 140. The system 140 can include a computing device 150 or any other similar device that includes a processor 152 and a memory 154, a display 156, an input device 158, one or more magnetometers 160 (for example, one or more vector magnetometers), one or more magnetic field generators 162 and, optionally, one or more sensors 164. The system 140 and its use and operation will be described herein with respect to the measurement of neural signals arising from signal sources in the brain of a user as an example. It will be understood, however, that the system can be adapted and used to measure other neural signals, other biological signals, as well as non-biological signals.

The computing device 150 can be a computer, tablet, mobile device, or any other suitable device for processing information. The computing device 150 can be local to the user or can include components that are non-local to the user including one or both of the processor 152 or memory 154 (or portions thereof). For example, in at least some embodiments, the user may operate a terminal that is connected to a non-local computing device. In other embodiments, the memory 154 can be non-local to the user.

The computing device 150 can utilize any suitable processor 152 including one or more hardware processors that may be local to the user or non-local to the user or other components of the computing device. The processor 152 is configured to execute instructions provided to the processor 152, as described below.

Any suitable memory 154 can be used for the computing device 150. The memory 154 illustrates a type of computer-readable media, namely computer-readable storage media. Computer-readable storage media may include, but is not limited to, nonvolatile, non-transitory, removable, and non-removable media implemented in any method or technology for storage of information, such as computer readable instructions, data structures, program modules, or other data. Examples of computer-readable storage media include RAM, ROM, EEPROM, flash memory, or other memory technology, CD-ROM, digital versatile disks ("DVD") or other optical storage, magnetic cassettes, magnetic tape, magnetic disk storage or other magnetic storage devices, or any other medium which can be used to store the desired information and which can be accessed by a computing device.

Communication methods provide another type of computer readable media; namely communication media. Communication media typically embodies computer-readable instructions, data structures, program modules, or other data in a modulated data signal such as a carrier wave, data signal, or other transport mechanism and include any information delivery media. The terms "modulated data signal," and "carrier-wave signal" includes a signal that has one or more of its characteristics set or changed in such a manner as to encode information, instructions, data, and the like, in the signal. By way of example, communication media includes wired media such as twisted pair, coaxial cable, fiber optics, wave guides, and other wired media and wireless media such as acoustic, RF, infrared, and other wireless media.

The display 156 can be any suitable display device, such as a monitor, screen, or the like, and can include a printer. In some embodiments, the display is optional. In some embodiments, the display 156 may be integrated into a single unit with the computing device 150, such as a tablet, smart phone, or smart watch. The input device 158 can be, for example, a keyboard, mouse, touch screen, track ball, joystick, voice recognition system, or any combination thereof, or the like.

The magnetometers 160 can be any suitable magnetometers including any suitable optical magnetometers (e.g., vector magnetometers), such as SERF zero-field vector magnetometers. The magnetic field generator(s) 162 can be, for example, Helmholtz coils, solenoid coils, planar coils, saddle coils, electromagnets, permanent magnets, or any other suitable arrangement for generating a magnetic field. The optional sensor(s) 164 can include, but are not limited to, one or more magnetic field sensors, position sensors, orientation sensors, accelerometers, image recorders, or the like or any combination thereof.

Figure 1B:
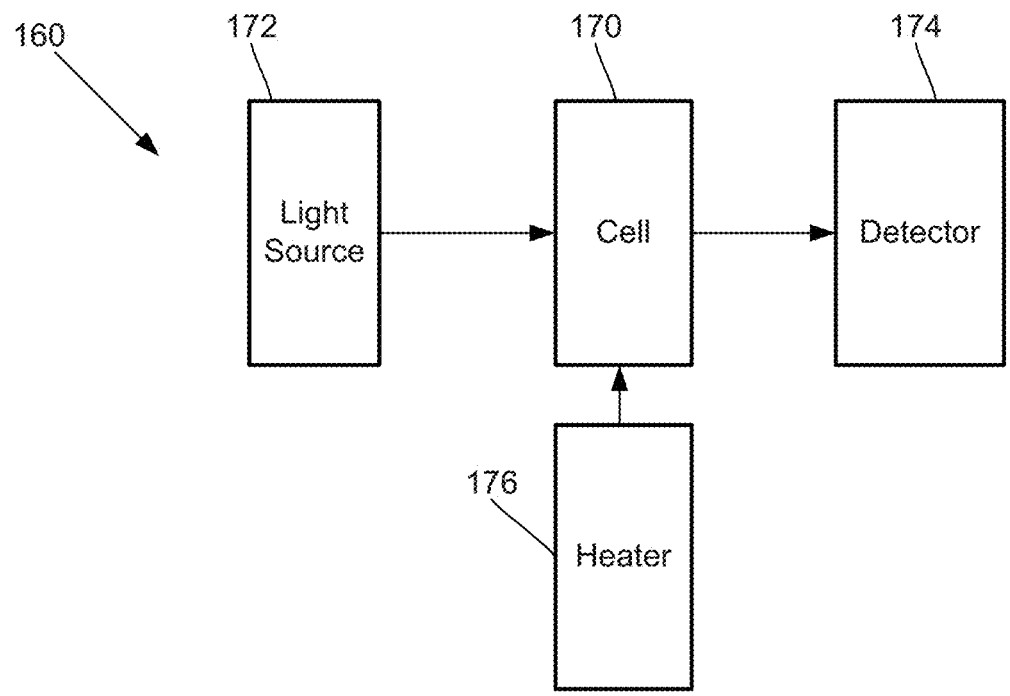
FIG. 1B is a schematic block diagram of one embodiment of a magnetometer, according to the invention.

A vector magnetometer can be considered a zero-field magnetometer with the ability to operate in SERF mode with suppressed spin-exchange relaxation. FIG. 1B is a schematic block diagram of one embodiment of a magnetometer 160 which includes a gas cell 170 (also referred to as a "cell") containing an alkali vapor (e.g. rubidium in natural abundance, isotopically enriched rubidium, potassium or cesium), quenching gas (e.g., nitrogen) and buffer gas (e.g., nitrogen, helium, or neon); a heating device 176 to heat the cell 170; a light source 172, such as a laser to optically pump the alkali atoms and to probe the gas cell, as well as optics (such as lenses, waveplates, and objects with reflective surfaces) for beam shaping and polarization control and for directing the light from the light source to the cell and detector; and a detector 174 (for example, an optical detector to measure the optical properties of the transmitted light field amplitude, phase, or polarization, as quantified through optical absorption and dispersion curves, spectrum, or polarization or the like or any combination thereof). Examples of suitable light sources include, but are not limited to, a diode laser (such as a vertical-cavity surface-emitting laser (VCSEL), distributed Bragg reflector laser (DBR), or distributed feedback laser (DFB)), light-emitting diode (LED), lamp, or any other suitable light source. Examples of suitable detectors include, but are not limited to, charge coupled device (CCD) camera sensor, photodiode array, single photon avalanche diode (SPAD) array, avalanche photodiode (APD) array, or any other suitable optical sensor array that can measure the change in transmitted light at the optical wavelengths of interest.

As indicated above, the system can include a magnetic field generator, such as one or more compensation coils to reduce, cancel, or "null" the ambient background magnetic field. The magnetometer or system can include other components such as a power supply, a readout system consisting of excitation magnetic coils, and the like.

Optical vector magnetometers, such as the zero-field vector magnetometers capable of operation in SERF (spin-exchange relaxation-free) mode, conventionally have been placed in a magnetic shield enclosure to reduce the Earth's magnetic field by about a factor of at least 1000 times in order to be able to operate. This is an example of passive shielding. These conventional systems can achieve high signal-to-noise and can measure biologically generated field due to neural activity, but the weight, size, and cost of a magnetic shielding can make the use of these systems prohibitive, particularly for, for example, small companies, individual users and many research labs, etc.

Active shielding, such as the use of electromagnets with a power supply, may provide a smaller form factor but conventionally has shown insufficient stability in a dynamically changing magnetic field environment, such as outside a magnetically shielded enclosure or disposed on an individual's head while that individual that is walking or moving his head.

In contrast to conventional arrangements, embodiments of a magnetic field measurement system are described herein that use 1) active electromagnets and 2) an array of optical detectors (e.g. camera) to enable SERF measurement outside of a shielded room. In at least some embodiments, these systems (which may include, for example, one or more magnetometer gas cells and an optical detector, such as a camera) can be used to measure magnetic gradients and classify or otherwise distinguish neural signals from environmental signals. Small amounts of passive magnetic shielding may also be used to in conjunction with active shielding to control and direct the background magnetic field.

Figure 2:
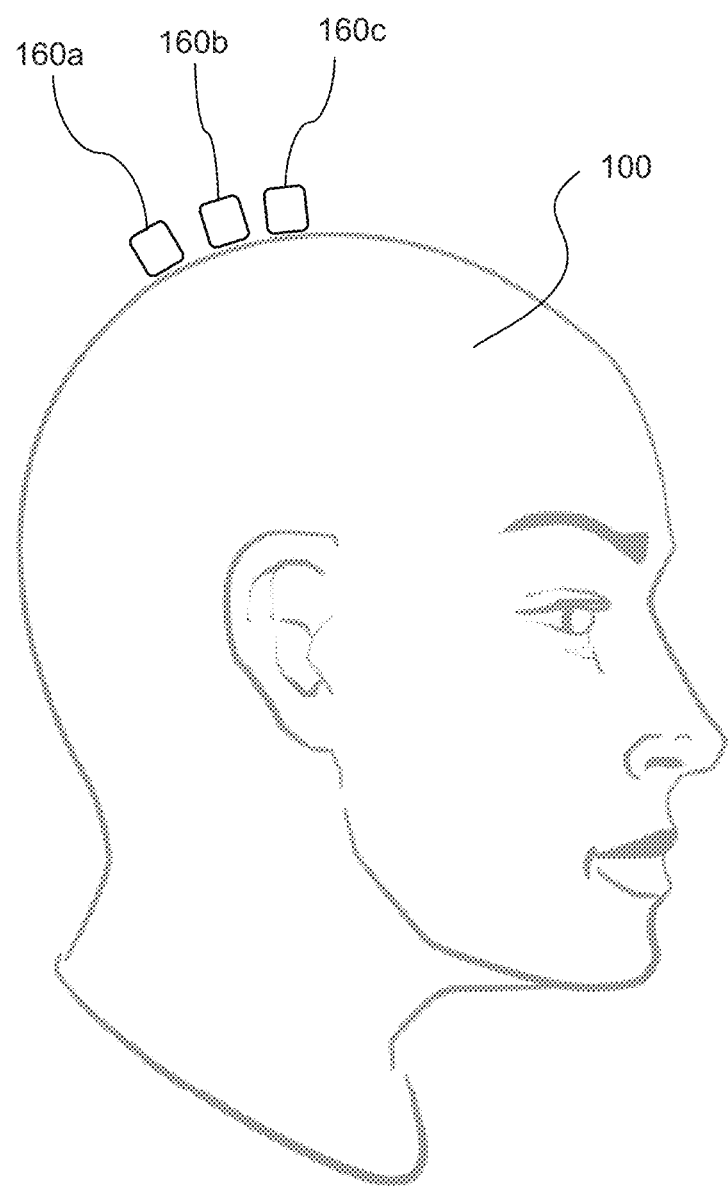
FIG. 2 is a schematic side view of one embodiment of an array of magnetometers for measuring magnetic fields generated in a brain of a user, according to the invention.
Figure 3:
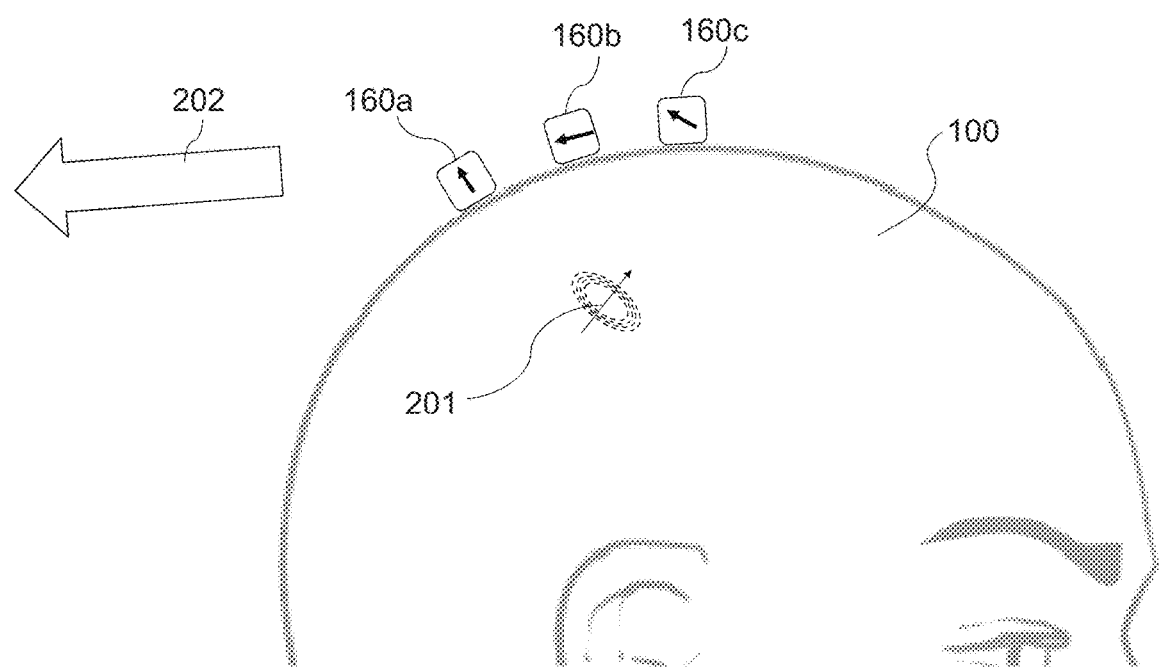
FIG. 3 is a schematic side view of one embodiment of the array of magnetometers of FIG. 2, a signal source in a brain of a user, and a direction of the ambient background magnetic field, according to the invention.

FIG. 2 illustrates one embodiment of a system shown with several vector magnetometers, 160a, 160b, 160c placed on a user's head 100 to measure neural activity. FIG. 3 illustrates vector magnetic fields (e.g., signals) that might be generated by the neural activity 201 on each of the magnetometers. For each of the magnetometers 160a, 160b, 106c, the magnetic field vector could be different in both direction and amplitude. The ambient background magnetic field 202 (including, for example, the Earth's magnetic field) is about $10^8$ times larger than magnetic field from the neural activity and is not shown to scale. Before the small magnetic fields arising from neural activity can be measured at the magnetometers 160a, 160b, 160c the ambient background magnetic field 202 can be suppressed so that the resulting magnetic field is within the dynamic range of the SERF magnetometer (e.g., the range of the width of the zero-field magnetic resonance) which in most devices is about 10 nT at cell temperatures of about 150° C. and is higher at more elevated temperatures. As an example, the suppression of the ambient background magnetic field can be achieved by generating a compensation field that is ideally equal and in the opposite direction of the ambient background magnetic field using, for example, one or more active electromagnets.

In at least some embodiments, in operation, an actively shielded magnetometer 160a, 160b, 160c includes one or more compensation coils (acting as a magnetic field generator 162 (FIG. 1A)) to suppress the ambient background magnetic field 202 from the environment (for example, the Earth's magnetic field) in order to measure the remaining magnetic field, such as a magnetic field arising from neural activity 201, as illustrated in FIG. 3. However, the ambient background magnetic field 202 may be continuously or periodically changing, so maintaining a perfect compensation field can be challenging.

Figure 4A:
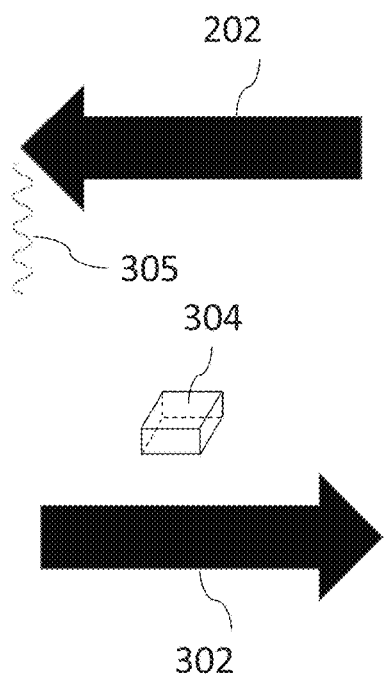
FIG. 4A is a schematic side view of one embodiment of using a compensation field to reduce or nullify the ambient background magnetic field, according to the invention.

FIG. 4A demonstrates how an ambient background magnetic field 202 and a compensation field 302 (generated by the compensation coils) cancel exactly at the gas cell 304 of a magnetometer so that the magnetic field due to neural activity can be measured while operating in the SERF mode. In at least some embodiments, it is sufficient if the ambient background magnetic field and the compensation field cancel each other to present a magnetic field that is within the dynamic range of the SERF magnetometer. It will be recognized, however, that the ambient background magnetic field can have a small, time-varying oscillation 305. In at least some embodiments, when this occurs, the magnetic field experienced by the gas cell 304 of the magnetometer may be no longer close enough to zero field to be in SERF mode.

Figure 4B:
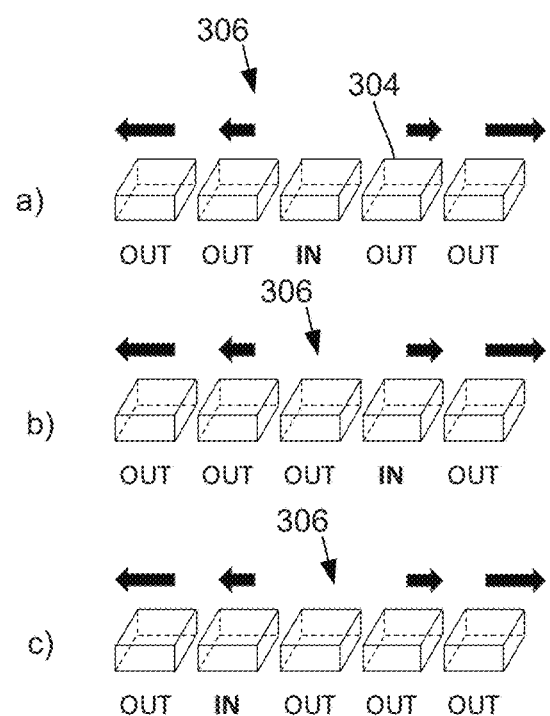
FIG. 4B illustrates examples of different conditions of an array of magnetometers by changing of the ambient background magnetic field, according to the invention.

FIG. 4B illustrates arrays 306 of gas cells 304 under different magnetic field conditions. Each gas cell 304 may experience a slightly different compensation field indicated by the small arrow above each of the cells. In example a) of FIG. 4B the ambient background magnetic field and compensation field are equal at the center gas cell, but differ along the other gas cells so that only the center gas cell is in the SERF mode. In Example b), the ambient background magnetic field is slightly increased resulting in a gas cell to the right of the center gas cell being in SERF mode. In Example c), the ambient background magnetic field is slightly decreased resulting in a gas cell to the left of the center gas cell being in SERF mode. In at least some embodiments, the system is arranged so that as the ambient background magnetic field changes in time at least one of the cells 304 is in SERF mode (indicated in FIG. 4B by "IN") while others gas cells are out of SERF mode (indicated in FIG. 4B by "OUT"). The small variation at each gas cell from the nominal compensation field (e.g., the difference between the compensation field and the ambient background magnetic field) can be referred to as a "perturbation field".

As illustrated in FIG. 4B, in at least some embodiments, the system includes a 1-dimensional array 306 of identical SERF magnetometers with gas cells 304. As described above, each of the magnetometers may experience a different composite magnetic field arising from the combination of the ambient background magnetic field 202 and the compensation field 302. In at least some embodiments, due to the selection of the compensation field, the farther a cell is from the center of that array the larger its magnetic field variation from the ideal compensation field. As a result of this inhomogeneity atoms within cells at different positions will experience different magnetic fields, which may result in some cells in some regions being outside of the SERF regime. In at least some embodiments, at any moment in time only a fraction of the cell array is within the intrinsic dynamic range (<10 nT) to perform a SERF measurement; however, as the ambient background magnetic field changes moment to moment at least one of the cells is in SERF mode.

In some embodiments, it may be desirable to adjust the compensation field of the array constantly, periodically, randomly, or using any other scheduled or non-scheduled arrangement such that the cells near the middle of the array remain in the SERF mode. Using this approach one or more of the outer cells may rarely be in SERF mode; however, one or more of the inner cells may always (or nearly always) be in SERF mode meaning that a measurement of neural activity can always be performed.

In at least some embodiments, the system may actively control the effective dynamic range or sensitivity (or both) of the array by increasing or decreasing the strength of the magnetic perturbation across the cells. Preferably, the system operates so that there is always at least one sensor in SERF mode. In at least some embodiments, the system may update or modify the compensation field to restore the gas cells at the center to operation in the SERF mode.

Figure 5:
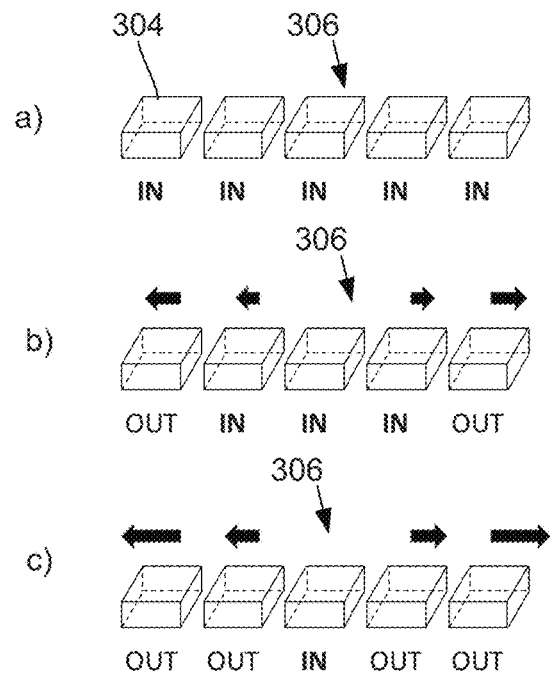
FIG. 5 illustrates examples of different conditions of an array of magnetometers by changing of a perturbation field, according to the invention.

In at least some embodiments, the effective dynamic range to sensitivity ratio can be adjusted by making the variation in magnetic field from cell to cell larger or smaller. FIG. 5 illustrates three examples to demonstrate variation in the sensitivity and dynamic range of the system by modifying the strength of the perturbation field at each cell 304. If the cell to cell magnetic field variation is zero then all the cells 304 would either be in or out of SERF mode together, as illustrated in Example a) of FIG. 5. Such an arrangement would be very sensitive but have a relatively low dynamic range. Accordingly, in at least some embodiments, a relatively high sensitivity occurs when the perturbation field is zero at all cells and each cell operates in the SERF mode. In at least some embodiments, this arrangement can achieve high sensitivity because the measured values from the individual gas cells can be averaged together to remove random noise (for example, electronic shot noise, photon shot noise, atomic shot noise, or the like or any combination thereof). However, in at least some embodiments, a small change in the ambient background magnetic field may result in all (or most) of the cells being no longer in the SERF mode. The situation illustrated in Example a) of FIG. 5 can be referred to as the 'zoom-in' mode.

If a larger perturbation in the cell to cell magnetic field is allowed or applied then several (for example, at least two, three, four, or more), but not all, of the cells are in the SERF mode as illustrated in Example b) of FIG. 5. In at least some embodiments, this reduces the sensitivity but if the ambient background magnetic field shifts expectantly at least some of the cells may remain in SERF mode.

In another example, illustrated in Example c) of FIG. 5, if only one cell is maintained in SERF mode, this would achieve a higher dynamic range but with lower sensitivity. Accordingly, in at least some embodiments, in a lower sensitivity case, only a single cell is ever in SERF mode, but it would take a very large ambient background magnetic field shift to remove all the cells out of SERF. This can be referred to as the 'zoom-out' mode.

FIGS. 4B and 5 illustrate a one-dimensional array of gas cells 304 or magnetometers. A two-dimensional array (see, for example, FIG. 6 on the left) or three-dimensional array of cells or magnetometers can also be used. Such arrangements may allow magnetic field perturbations across multiple (e.g., two or three) dimensions simultaneously.

In the preceding examples the system included an array of gas cells placed closely together. In some embodiments, this may be challenging to implement if each gas cell includes its own light source, detector, heater, and the like. Examples of such arrangements can be found in U.S. Provisional Patent Application 62/719,471, incorporated herein by reference.

In some embodiments, a single cell can be used with different portions or domains within the cell experiencing different magnetic field perturbations. This embodiment will be discussed herein using a single cell, but it will be understood that multi-cell arrangements with multiple portions or domains in each (or at least one) of the cells are utilized or defined. The features and methods described herein for a single cell can be applied to these multi-cell arrangements.

Figure 6:
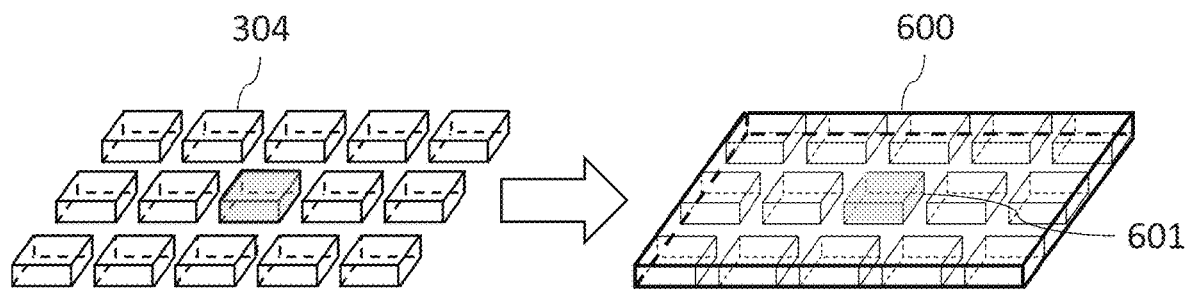
FIG. 6 illustrates one embodiment of a two-dimensional array of gas cells (left) and a single cell with multiple domains (right), according to the invention.

In these arrangements, portions or domains within the cell could be in SERF mode while other portions or domains of the cell are not. Accordingly, as illustrated in FIG. 6, a single cell 600 could be equivalent to, or at least similar to, an array of cells 304 with one of more of the portions or domains 601 of the cell 600 being in SERF mode. FIG. 6 illustrates just one possible selection of domains 601 in the cell 600, but any other suitable selection of domains (which may or may not be contiguous or regular-shaped) can be used. The "zoom-out" and "zoom-in" modes, as well as intermediate modes, described above can also be applied to the cell 600 by changing the amount of variation in magnetic field across the cell 600.

In at least some embodiments, the mean drift velocity of the alkali atoms in the cell 600 is reduced sufficiently (for example, through the use of a buffer gas, laser cooling, or internal structure of the gas cell, or any combination thereof or the like) to limit thermal migration between the portions or domains during the magnetic field measurement periods. In at least some embodiments, when using a single cell or a larger cell, optical detection may be performed using an array of detectors. In at least some embodiments, the spatial resolution (e.g., pixel size) could be equal to or less than the size of each of the portions/domains within the cell. This detector array may be achieved, for example, with a charge coupled device (CCD) camera sensor, photodiode array, single photon avalanche diode (SPAD) array, avalanche photodiode (APD) array, or any other suitable optical detector array that can measure the change in transmitted light at the optical wavelengths of interest.

Figure 7:
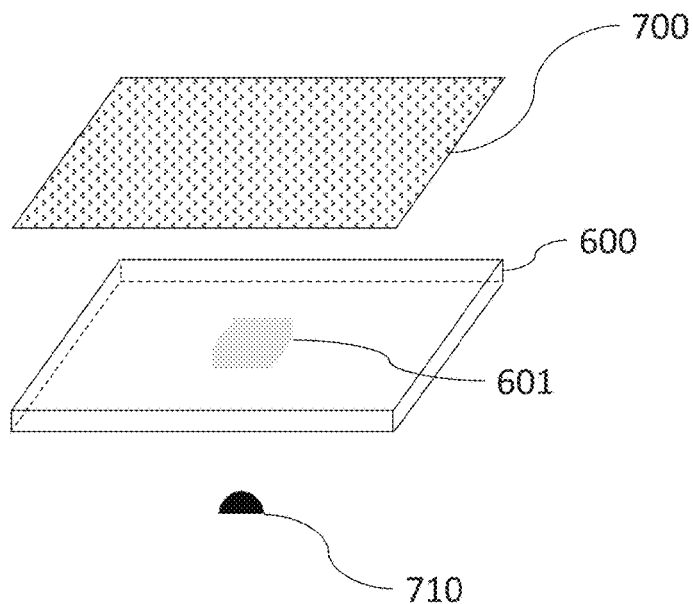
FIG. 7 is a schematic perspective view of one embodiment of magnetometer with a gas cell, light source, and optical detector, according to the invention.
Figure 8:
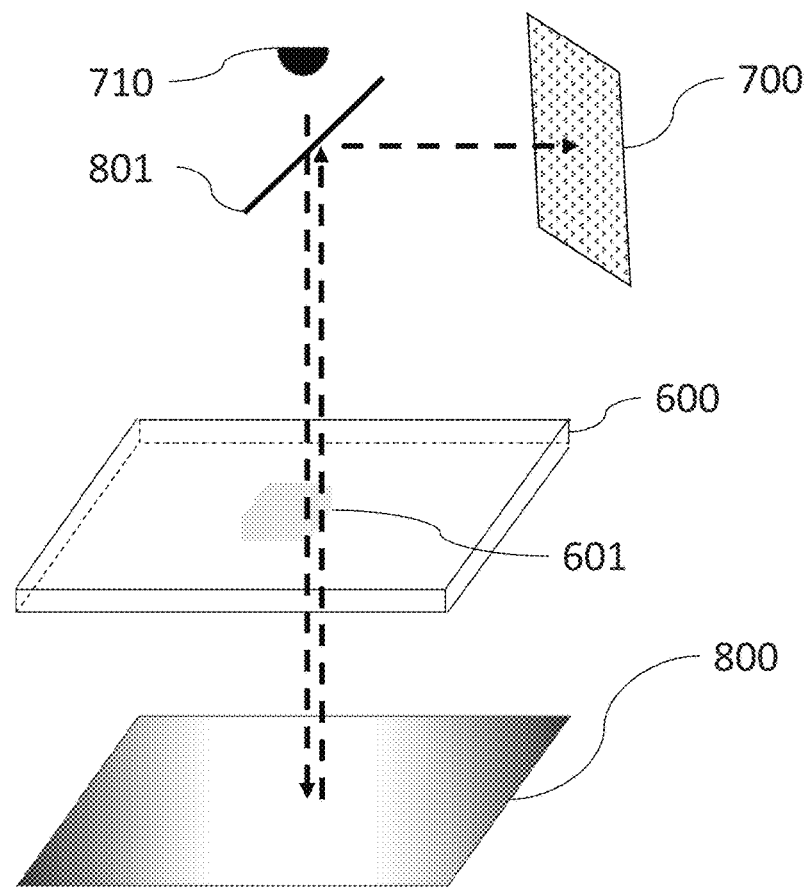
FIG. 8 is a schematic perspective view of another embodiment of magnetometer with a gas cell, light source, and optical detector, according to the invention.

FIG. 7 illustrates one embodiment of a system in which an optical detector array 700 receives light that passes through the cell 600. In at least some embodiments, the light source 710 is disposed on the opposite side cell 600 from the optical detector array 700 and the light is transmitted through the cell directly to the detector array. FIG. 8 illustrates another embodiment of a system, but this time the light source 710 and the optical detector array 700 are on the same side of the cell 600 and a mirror 800 is placed below the cell. The light source 710 can be a laser, LED, or any other suitable light source, as described above. The light is emitted by the light source 710, goes through a beam splitter 801, through the cell 600, reflects from the mirror 800, then goes through the cell again, reflects from the beam splitter 801, and is collected by the optical detector array 700. As described above, the optical detector array 700 measures the optical properties of the transmitted light field amplitude, phase, or polarization, as quantified through optical absorption and dispersion curves, spectrum, or polarization or the like or any combination thereof.

In at least some embodiments, when using an optical detector array (for example, a camera or sensor array) to measure the variability of the magnetic field across the cell it is also possible to measure the magnetic gradient, or spatial variation, of both the magnetic fields generated by neural activity and the magnetic fields from the environment. The Earth's magnetic field, as well as the fields generated by distant objects, typically has low spatial variability, while local fields may have high spatial variability. The magnetic field strength, as measured across the optical detector array, can be fit with analytic functions including, but not limited to, polynomials to reject or reduce the common mode (i.e., zeroth order gradient) from linear gradient and higher order gradient signals. Machine learning, artificial intelligence, computational neural networks, and other analytic tools may also be employed for classification or analysis of signals.

Figure 9:
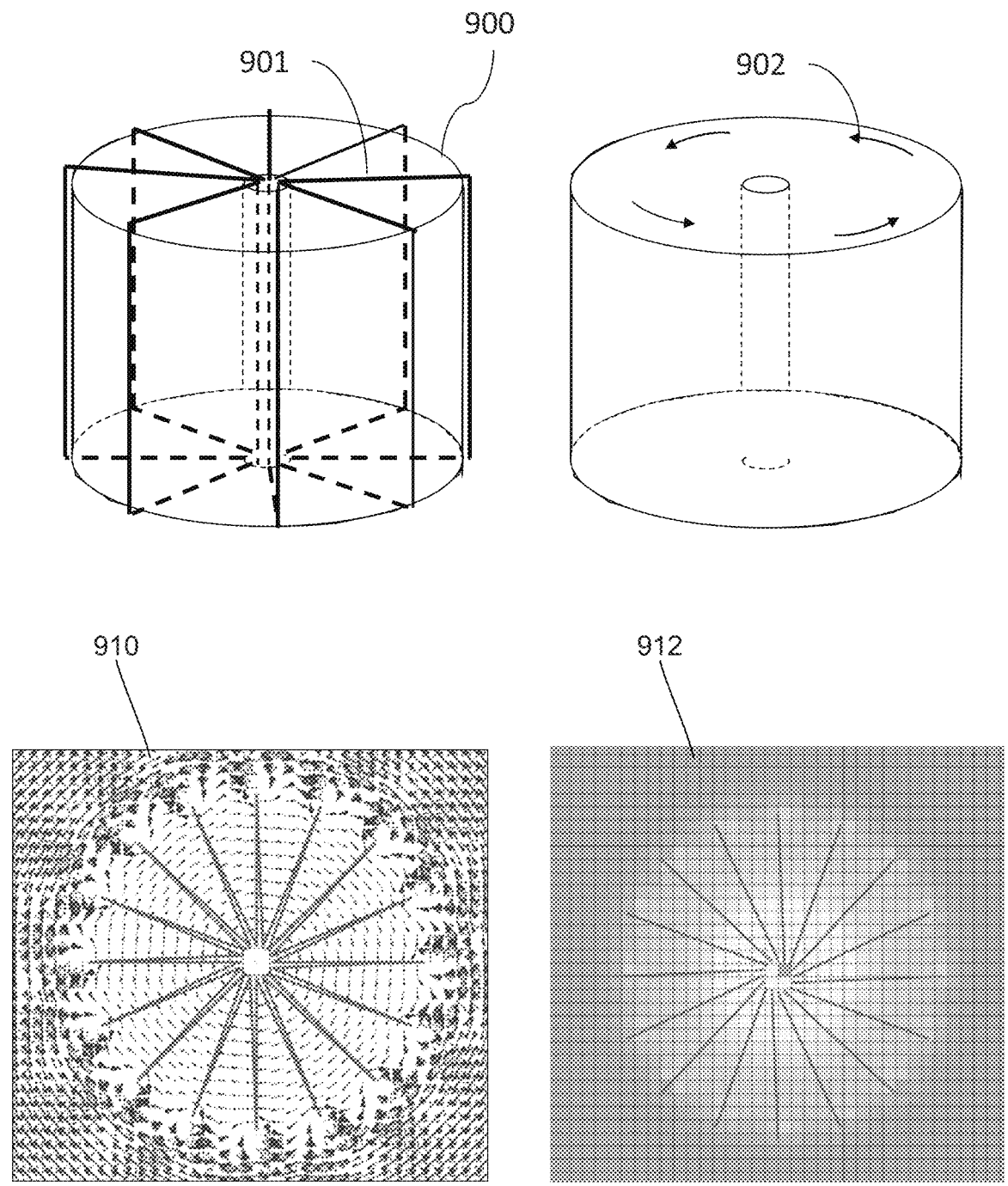
FIG. 9 includes a schematic perspective view of one embodiment of a gas cell with a toroidal magnetic field generator, as well as three representations of a magnetic field pattern that can be generated using a magnetic field generator, according to the invention.

Arrangements for controlling or modifying the magnetic domains or portions of the cell 600 can be useful in at least some embodiments. Magnetic field domains can be created using magnetic field generators, such as gradient coils similar to those used in MRI (magnetic resonance imaging), toroid coils, or other magnetic field generating or modifying components. FIG. 9 illustrates an example of a magnetic field pattern created by enclosing the single cell 900 in a toroid coil 901. Reference numeral 902 represents a portion of the magnetic field direction. The pattern 910 is a computer simulation illustrating magnetic field direction, but not magnitude. The pattern 912 is a computer simulation illustrating magnetic field magnitude, but not direction. Other magnetic field generators include, but are not limited to, anti-Helmholtz pairs, fingerprint coils, arbitrary current pattern generators, and the like. Both non-linear and linear magnetic field patterns can be used to generate domains in a cell 900. In at least some embodiments, the system is configured to produce designed and controlled perturbation fields to achieve the 'zoom-in" or "zoom-out" or intermediate modes described above. The perturbation field generator may be, for example, one or more toroid, solenoid, fingerprint, or other coils, or any other suitable magnetic field generator that can push at least part of the cell outside the SERF mode for at least part of a magnetic field measurement period.

In at least some embodiments, the system may be configured to enable the system to operate in the 'zoom-out' mode to quickly find the approximate strength of the background magnetic field then enter the 'zoom-in' mode to take high sensitivity measurement of neural activity once the ambient background magnetic field has been reduced or nulled by the compensation coil(s) or other magnetic field generators. In a changing magnetic environment the ability to dynamically change the compensation field in response to changes in the ambient background magnetic field is particularly suitable for use outside a passive shield environment. Note that even if the ambient background magnetic field is unchanging (e.g., static) that motion (for example, movement, rotation or vibration) of the user within that static background may appear as a dynamically changing magnetic field environment.

In at least some embodiments, in the 'zoom-out' mode the accuracy of the measured magnetic is reduced as a significant volume of the gas cell (or a significant number of the cells in the array) is outside the SERF regime. In at least some embodiments, sensitivity scales as the square root of the number of alkali atoms; therefore, if only 50% of the cell contributes to the SERF measurement then the signal to noise is reduced by $1-(0.5)^{1/2}$ or about 30%. In at least some embodiments, a tradeoff between dynamic range and sensitivity can be adjusted and updated (for example, on a continuous, periodic, as-needed, or as-desired basis) based on the magnetic stability of the local environment.

In at least some embodiments, the system may enable localization of signal sources arising from outside the region of interest (e.g. outside the human head) through the measurement of the change of magnetic field in different regions of the cell or array of cells. This can include the use of an array of detectors (for example, a CCD camera, a photodiode array, a single photon avalanche detector array, or the like).

In at least some embodiments, changes in the direction or amplitude (or any combination thereof) of the ambient background magnetic field can result in both changes in the measured magnetic field amplitude on a particular pixel as well as translation of the maximum signal pixel across the optical detector array.

In at least some embodiments, software or hardware can be used to fit the pixel data to mathematical functions. For example, fitting the pixel data to two-dimensional polynomial functions can provide high-order gradient mapping. Gradients can be used to characterize signals as local or distant and may allow better localization of signal within the brain. Artificial neural networks or other machine learning may be used in addition or alternatively for feature extraction. In at least some embodiments, this feature may be particularly productive when using the most 'zoomed-in' setting when the magnetic field environment is very quiet and artificial magnetic perturbations across the cell are reduced or minimized.

In at least some embodiments, one or more of the following advantages can be obtained: 1) measurement of magnetic fields generated by biological processes including neural activity outside a shielded environment while the user is moving through a background electromagnetic field, or 2) use of a camera or other detector to measure higher order gradients across the cell to improve localization of magnetic currents both inside the target region (human head) or outside the target region (environmental signals/noise sources).

Figure 10:
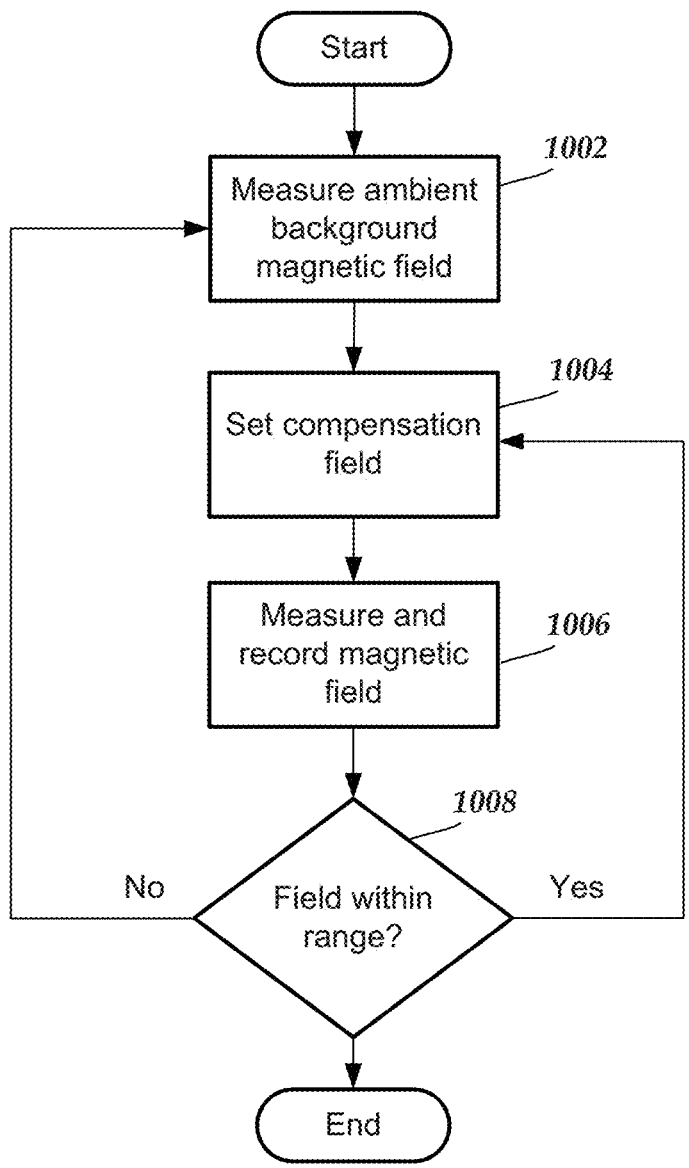
FIG. 10 is a flow diagram of one embodiment of a method of observing or measuring a magnetic field generated by a signal source, according to the invention.

FIG. 10 illustrates one embodiment of a method of measuring or observing a signal source, such as a biological signal source, that produces a magnetic field. An array of magnetometers 160 (or a single cell 600—FIG. 6) of a magnetic field measurement system 140 is positioned for observing or measuring the signal source. In step 1002, the ambient background magnetic field is measured using a sensor 164 or the magnetometers 160 or single cell 600 to give an estimate of the magnetic field. In step 1004, one or more compensation fields are generated using the magnetic field generator(s) 164 to reduce or approximately cancel the ambient background magnetic field.

In step 1006, the magnetic field of the signal source of interest (e.g., a neural signal) is measured and recorded. In step 1008, the system determines whether the magnetic field within the dynamic range of the magnetometers 160 or single cell 600. If not, the system returns to step 1002 to re-determine the compensation field. If so, the system returns to step 1004 to make any minor adjustments needed to the compensation field to then make another measurement of the magnetic field from the signal source.

Figure 11:
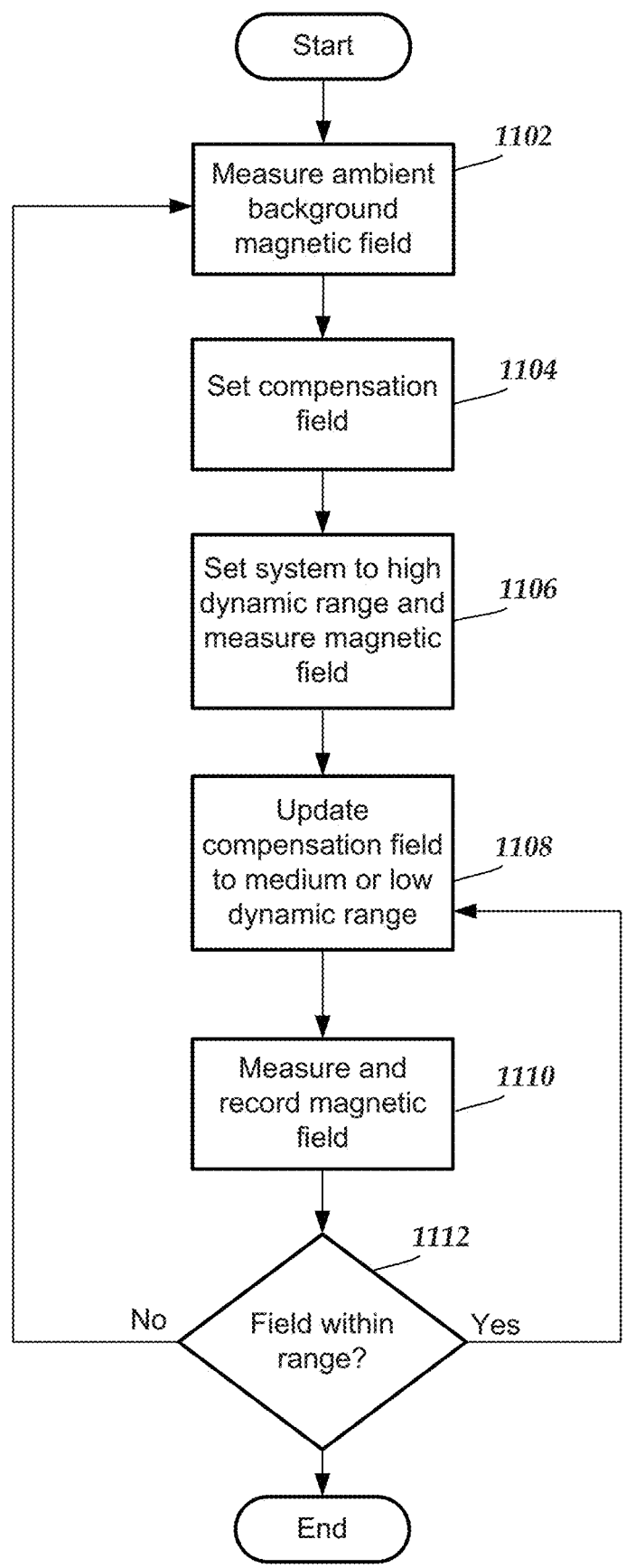
FIG. 11 is a flow diagram of another embodiment of a method of observing or measuring a magnetic field generated by a signal source, according to the invention.

FIG. 11 illustrates one embodiment of a method of measuring or observing a signal source, such as a biological signal source, that produces a magnetic field. An array of magnetometers 160 (or a single cell 600—FIG. 6) of a magnetic field measurement system 140 is positioned for observing or measuring the signal source. In step 1102, the ambient background magnetic field is measured using a sensor 164 or the magnetometers 160 or single cell 600 to give an estimate of the magnetic field. In step 1104, one or more compensation fields are generated using the magnetic field generator(s) 164 to reduce or approximately cancel the ambient background magnetic field.

In step 1106, the magnetometers 160 or single cell 600 is set to a high dynamic range (for example, with only one or a small number of the magnetometer 160 or regions/domains of the single cell 600 in SERF mode) to measure the magnetic field. This measurement may be made, for example, to further refine the determination of the ambient background magnetic field (which may already have been reduced in step 1104) to modify the compensation field. In step 1108, the compensation field is then updated or modified to place the magnetometers 160 or single cell 600 in a medium or low dynamic range (for example, with at least half or all of the magnetometer 160 or regions/domains of the single cell 600 in SERF mode). The compensation field, for those magnetometers or regions/domains of the single cell in SERF mode, will reduce the ambient background magnetic field to zero or near zero. In step 1110, the magnetic field of the signal source of interest (e.g., a neural signal) is measured and recorded.

In step 1112, the system determines whether the magnetic field within the dynamic range of the magnetometers 160 or single cell 600. If not, the system returns to step 1102 to re-determine the compensation field. If so, the system returns to step 1108 to make any minor adjustments needed to the compensation field to then make another measurement of the magnetic field from the signal source.

The methods, systems, and units described herein may be embodied in many different forms and should not be construed as limited to the embodiments set forth herein. Accordingly, the methods, systems, and units described herein may take the form of an entirely hardware embodiment, an entirely software embodiment or an embodiment combining software and hardware aspects. The methods described herein can be performed using any type of processor or any combination of processors where each processor performs at least part of the process.

It will be understood that each block of the flowchart illustrations, and combinations of blocks in the flowchart illustrations and methods disclosed herein, can be implemented by computer program instructions. These program instructions may be provided to a processor to produce a machine, such that the instructions, which execute on the processor, create means for implementing the actions specified in the flowchart block or blocks disclosed herein. The computer program instructions may be executed by a processor to cause a series of operational steps to be performed by the processor to produce a computer implemented process. The computer program instructions may also cause at least some of the operational steps to be performed in parallel. Moreover, some of the steps may also be performed across more than one processor, such as might arise in a multi-processor computer system. In addition, one or more processes may also be performed concurrently with other processes, or even in a different sequence than illustrated without departing from the scope or spirit of the invention.

The computer program instructions can be stored on any suitable computer-readable medium including, but not limited to, RAM, ROM, EEPROM, flash memory or other memory technology, CD-ROM, digital versatile disks ("DVD") or other optical storage, magnetic cassettes, magnetic tape, magnetic disk storage or other magnetic storage devices, or any other medium which can be used to store the desired information and which can be accessed by a computing device.

The above specification provides a description of the invention and its manufacture and use. Since many embodiments of the invention can be made without departing from the spirit and scope of the invention, the invention also resides in the claims hereinafter appended.

What is claimed as new and desired to be protected by Letters Patent of the United States is:

1. A magnetic field measurement system, comprising:
    an array of magnetometers, wherein each magnetometer is configured to operate in a measurement mode over a first range of magnetic fields;
    at least one magnetic field generator with the at least one magnetic field generator configured to generate a compensation field across the array of magnetometers; and
    a controller coupled to the magnetometers and the at least one magnetic field generator, the controller comprising a processor configured for receiving signals from the magnetometers, observing or measuring a magnetic field from the received signals, and controlling the at least one magnetic field generator to generate the compensation field resulting in one or more of the magnetometers operating in the measurement mode, wherein the processor is further configured for adjusting a dynamic range and sensitivity of the array by adjusting a spatial variation of the compensation field to increase or decrease the number of the magnetometers of the array that operate in the measurement mode.

2. The magnetic field measurement system of claim 1, wherein the magnetometers utilize alkali metal vapor and the measurement mode is a spin-exchange-relaxation-free (SERF) mode.

3. The magnetic field measurement system of claim 1, wherein the processor is configured to increase the dynamic range of the array of magnetometers by adjusting the spatial variation of the compensation field to decrease the number of the magnetometers of the array operating in the measurement mode.

4. The magnetic field measurement system of claim 1, wherein the processor is configured to decrease the dynamic range of the array of magnetometers by adjusting the spatial variation of the compensation field to increase the number of the magnetometers of the array operating in the measurement mode.

5. The magnetic field measurement system of claim 1, wherein the processor is configured to increase the sensitivity of the array of magnetometers by adjusting the spatial variation of the compensation field to increase the number of the magnetometers of the array operating in the measurement mode.

6. The magnetic field measurement system of claim 1, wherein the processor is configured to decrease the sensitivity of the array of magnetometers by adjusting the spatial variation of the compensation field to decrease the number of the magnetometers of the array operating in the measurement mode.

7. The magnetic field measurement system of claim 1, wherein the processor is configured for controlling the at least one magnetic field generator to adjust the spatial variation of the compensation field so that the magnetometers disposed in the center of the array operate in the measurement mode.

8. The magnetic field measurement system of claim 1, wherein the array of magnetometers is a one-dimensional array.

9. The magnetic field measurement system of claim 1, wherein the array of magnetometers is a two- or three-dimensional array.

10. A magnetic field measurement system, comprising:
at least one magnetometer, wherein each of the at least one magnetometer comprises a gas cell and a detector array, wherein the detector array is configured to individually observe each of a plurality of domains in the gas cell;
at least one magnetic field generator with the at least one magnetic field generator configured to generate a compensation field across the at least one magnetometer; and
a controller coupled to the at least one magnetometer and the at least one magnetic field generator, the controller comprising a processor configured for receiving signals from the detector array of the at least one magnetometer, observing or measuring a magnetic field from the received signals, and controlling the at least one magnetic field generator to generate the compensation field resulting in one or more of the domains of the gas cell of the at least one magnetometer operating in a measurement mode, wherein the processor is further configured for adjusting a dynamic range and sensitivity of the array by adjusting a spatial variation of the compensation field to increase or decrease the number of the domains of the at least one magnetometer that operate in the measurement mode.

11. The magnetic field measurement system of claim 10, wherein the gas cell is an alkali metal vapor cell and the measurement mode is a spin-exchange-relaxation-free (SERF) mode.

12. The magnetic field measurement system of claim 10, wherein the processor is configured to increase the dynamic range of the detector array by adjusting the spatial variation of the compensation field to decrease the number of the domains operating in the measurement mode.

13. The magnetic field measurement system of claim 10, wherein the processor is configured to decrease the dynamic range of the detector array by adjusting the spatial variation of the compensation field to increase the number of the domains operating in the measurement mode.

14. The magnetic field measurement system of claim 10, wherein the processor is configured to increase the sensitivity of the detector array by adjusting the spatial variation of the compensation field to decrease the number of the domains operating in the measurement mode.

15. The magnetic field measurement system of claim 10, wherein the processor is configured to decrease the sensitivity of the detector array by adjusting the spatial variation of the compensation field to increase the number of the domains operating in the measurement mode.

16. The magnetic field measurement system of claim 10, wherein the processor is configured for controlling the at least one magnetic field generator to adjust the spatial variation of the compensation field so that the domains disposed in the center of the at least one magnetometer operate in the measurement mode.

17. A method of measuring a magnetic field, comprising:
measuring an ambient background magnetic field using the magnetic field measurement system of claim 1;
setting the compensation field based on the measurement of the ambient background magnetic field; and
measuring and recording the magnetic field.

18. The method of claim 17, further comprising
setting the magnetic field measurement system to a high dynamic range and measuring the magnetic field;
updating the compensation field, based on the measuring of the magnetic field, to set the magnetic field measurement system to a lower dynamic range;
wherein measuring and recording the magnetic field comprises measuring and recording the magnetic field with the magnetic field measurement system set to the lower dynamic range.

19. A method of measuring a magnetic field, comprising:
measuring an ambient background magnetic field using the magnetic field measurement system of claim 10;
setting the compensation field based on the measurement of the ambient background magnetic field; and
measuring and recording the magnetic field.

20. The method of claim 19, further comprising
setting the magnetic field measurement system to a high dynamic range and measuring the magnetic field;
updating the compensation field, based on the measuring of the magnetic field, to set the magnetic field measurement system to a lower dynamic range;
wherein measuring and recording the magnetic field comprises measuring and recording the magnetic field with the magnetic field measurement system set to the lower dynamic range.

* * * * *